United States Patent [19]
Saito et al.

[11] Patent Number: 6,140,747
[45] Date of Patent: Oct. 31, 2000

[54] PIEZOELECTRIC TRANSFORMER ELEMENT AND METHOD OF MANUFACTURING THE SAME

[75] Inventors: Susumu Saito; Takayuki Inoi, both of Tokyo, Japan

[73] Assignee: NEC Corporation, Tokyo, Japan

[21] Appl. No.: 09/209,424

[22] Filed: Dec. 11, 1998

[30] Foreign Application Priority Data

Dec. 16, 1997 [JP] Japan ..................................... 9-346193

[51] Int. Cl.$^7$ .................................................. H01L 41/08
[52] U.S. Cl. ........................... 310/359; 310/366; 310/328
[58] Field of Search .................................... 310/358, 359, 310/366, 330, 331, 352, 328

[56] References Cited

U.S. PATENT DOCUMENTS 4,510,410  4/1985  Yuhara et al. ....................... 310/313 D

FOREIGN PATENT DOCUMENTS

| 2-100306 | 4/1990 | Japan . |
| 8-107241 | 4/1996 | Japan . |
| 9-069658 | 3/1997 | Japan . |
| 11-274594 | 10/1999 | Japan . |

*Primary Examiner*—Elvin Enad
*Assistant Examiner*—Peter Medley
*Attorney, Agent, or Firm*—Sughrue, Mion, Zinn, Macpeak & Seas, PLLC

[57] ABSTRACT

A piezoelectric transformer element includes a piezoelectric plate made of a ceramic material, and input and output electrodes formed on the piezoelectric plate, and outputs a voltage from the output electrode upon application of a voltage to the input electrode. A reinforcing layer is selectively disposed on that portion of the piezoelectric plate where tensile stress concentrates when the piezoelectric transformer element is driven. The reinforcing layer is made of a material having the same composition as that of the ceramic material forming the piezoelectric plate and a particle size, after sintering, smaller than that of the ceramic material. A method of manufacturing a piezoelectric transformer element includes the steps of selectively disposing a reinforcing layer made of a ceramic powder at a required portion of each of ceramic sheets that form a piezoelectric plate of the piezoelectric transformer element, and molding and sintering the ceramic sheets and the ceramic powder, thus fabricating the piezoelectric plate. The ceramic powder has the same composition as that of the ceramic sheets of the piezoelectric plate and a specific powder surface area larger than that of the piezoelectric plate.

5 Claims, 8 Drawing Sheets

PIEZOELECTRIC TRANSFORMER ELEMENT AND METHOD OF MANUFACTURING THE SAME

BACKGROUND OF THE INVENTION

1. Field of the Invention

The present invention relates to a piezoelectric transformer element made of a ceramic material and, more particularly, to a compact, low-profile piezoelectric transformer element of which down sizing and high reliability are required and which generates a high voltage, and a method of manufacturing the same.

2. Description of the Prior Art

Conventionally, in a backlight inverter for a liquid crystal display, an inverter for lighting a fluorescent tube, a high-voltage power supply circuit for a copying machine, and the like, a winding electromagnetic transformer is used as a high-voltage generating element. A piezoelectric transformer has attracted an attention due to requirements such as reduction in the generated electromagnetic noise, power consumption, height, and the like. FIG. 1 shows the structure of a conventional symmetric Rosen tertiary stacked piezoelectric transformer. In this symmetric Rosen tertiary stacked piezoelectric transformer, of a rectangular ceramic piezoelectric plate 1 of a stacked-layer structure having electrodes formed on its surface, the two end portions of the piezoelectric plate 1 in the direction of length form driving portions 21 serving as the input portions of the piezoelectric transformer. In the driving portions 21, planar input electrodes 2a and 2b, and 3a and 3b, are formed on the upper and lower surfaces, respectively, of the piezoelectric plate 1. These two end portions are polarized in the direction of thickness. Electrodes 4a and 4b, and 5a and 5b, electrically connect the input electrodes 2a and 2b, and 3a and 3b, to internal electrodes (not shown) formed among the stacked layers of the piezoelectric plate 1. The central portion of the piezoelectric plate 1 forms a power generating portion 22 serving as the output portion. In the power generating portion 22, output electrodes 6a and 6b are formed on the upper and lower surfaces, respectively, of the piezoelectric plate 1. This central portion is polarized in the direction of length of the piezoelectric element.

The operation of this conventional piezoelectric transformer element will be described with reference to FIGS. 2A to 2C. FIG. 2A is a schematic sectional view of the piezoelectric transformer, FIG. 2B is a graph showing the distribution of displacement of the piezoelectric transformer obtained when it vibrates in the 3/2-wavelength resonance mode in the direction of length, and FIG. 2C is a graph showing the distribution of stress obtained at this time and the types of stress. When a voltage is applied from external terminals 7a and 7b shown in FIG. 1 to the input electrodes 2a and 2b, and 3a and 3b, of the driving portions 21, an electric field is applied to the driving portions 21 in the direction of polarization. As shown in FIG. 2B, longitudinal vibration in the direction of length is excited by the inverse piezoelectric effect in which the element is displaced in a direction perpendicular to the direction of polarization, and the entire piezoelectric element vibrates. In the power generating portion 22, as shown in FIG. 2C, mechanical strain occurs in the direction of polarization. Then, due to the piezoelectric positive effect in which a potential difference occurs in the direction of polarization, a voltage having the same frequency as that of the input voltage is output from the output electrodes 6a and 6b to external terminals 8a and 8b. If the driving frequency is set to be equal to the resonance frequency of the piezoelectric plate 1, a very high output voltage can be obtained. The output that can be obtained from the piezoelectric transformer element is proportional to the power of mechanical vibration, and is proportional to the sectional area of the piezoelectric plate 1 in terms of structure.

Accordingly, in order to obtain a large output from a piezoelectric transformer element, the element size may be increased or the vibration speed of the piezoelectric transformer element may be increased. To increase the element size is not practical because of the requirement for downsizing of the equipment on which the power supply is mounted. Therefore, an increase in output of the piezoelectric transformer is achieved by increasing the vibration speed. When, however, the vibration speed is increased, it may exceed the mechanical strength of the element. Then, a desired output cannot be obtained but the element fractures. To increase the element strength while avoiding element breakdown, a fine powder is used as the material to form the piezoelectric ceramic material, and the particle size of the ceramic material after calcination is decreased to make the ceramic material dense. With this technique of increasing the element strength by using a fine powder, however, the finer the powder, the more difficult it becomes to handle. In the green sheet process, powder dispersion is not easy, and the pressing density cannot be stabilized, accordingly making it difficult to sufficiently increase the element strength. When the ceramic particle size of the driving portions or power generating portion decreases, the same piezoelectric characteristics as those conventionally obtained cannot be obtained with the same application voltage as that conventionally applied. In order not to degrade the transformer efficiency, the design must be changed by reconsidering the polarization conditions.

It is proposed to employ a technique for increasing the element strength by improving the structure of the ceramic material that forms the element. For example, Japanese Unexamined Patent Publication Nos. 8-107241 and 2-100306 disclose a stacked ceramic component in which, in order to eliminate a step which is generated by the thickness of the internal electrode and which produces cracking or separation in the stacked ceramic component such as a piezoelectric transformer or ceramic capacitor, spacers each having a thickness almost equal to that of the internal electrode are formed at portions excluding the internal electrodes. More specifically, FIGS. 3A to 3E are exploded perspective views of a piezoelectric transformer element disclosed in Japanese Unexamined Patent Publication No. 8-107241. Spacers 112a to 112e are formed, together with internal electrodes 110a to 110e, at different planar positions of ceramic sheets 111a to 111e to be stacked, in order to prevent cracking and separation during pressing. Similarly, In Japanese Unexamined Patent Publication No. 2-100306 shown in FIGS. 4A and 4B, an internal electrode 210 is formed on one ceramic green sheet 211 that partly constitutes a stacked electronic component. A spacer 212 is formed in the other ceramic green sheet 211 which is to be stacked on the one ceramic green sheet 211, and surrounds the internal electrode 210 of the one ceramic green sheet 211. The spacer 212 prevents cracking and separation in pressing.

With the techniques described in these references, however, a spacer is merely formed at that portion of a ceramic member to be stacked, which excludes an internal electrode. Although these techniques are effective to prevent cracking and separation resulting from the stress generated during pressing or sintering, it is difficult to eliminate element breakdown which results from stress concentration that occurs while the piezoelectric transformer element is driven. In particular, in the symmetric Rosen tertiary piezoelectric transformer as shown in FIG. 1, since the point of concentration of tensile stress is present on a region at the center in the direction of length of the element where the output electrodes are to be formed, the spacer described above does not effectively function against this tensile stress, and in most cases the element fractures at the output electrodes and near them.

SUMMARY OF THE INVENTION

The present invention has been made in consideration of the above situation in the prior art, and has as its object to provide a piezoelectric transformer element in which a portion where tensile stress concentrates during vibration is selectively reinforced so that the element does not easily crack during driving while the element polarization state is not changed, and a method of manufacturing the same.

In a piezoelectric transformer element according to the present invention that achieves the above object, a reinforcing layer, made of a ceramic material having the same composition as that of a ceramic material forming a piezoelectric plate and a particle size, after sintering, smaller than that of the ceramic material, is selectively disposed on that portion of the piezoelectric plate where tensile stress concentrates when the piezoelectric transformer element is driven. The piezoelectric plate is formed of a ceramic material consisting of a ceramic powder having a specific powder surface area of 2 $m^2/g$, and the reinforcing layer is formed of a ceramic material consisting of a ceramic powder having a specific powder surface area falling within the range from 3 $m^2/g$ (inclusive) to 5 $m^2/g$ (inclusive). The reinforcing layer is formed to have a width, in a direction of length of the piezoelectric plate, which falls within the range from 5% (inclusive) to 12% (inclusive) of the length of the piezoelectric plate.

In a method of manufacturing a piezoelectric transformer element that achieves the above object comprises the steps of selectively disposing, at a required portion of each of ceramic sheets that form a piezoelectric plate of the piezoelectric transformer element, a reinforcing layer made of a ceramic powder having the same composition as that of the ceramic sheets of the piezoelectric plate and a specific powder surface area larger than that of the piezoelectric plate, and molding and sintering the ceramic sheets and the ceramic powder, thus fabricating the piezoelectric plate. A ceramic material having a specific powder surface area of 2 $m^2/g$ is used to form the ceramic sheets of the piezoelectric plate, and a ceramic powder having a specific powder surface area falling within the range from 3 $m^2/g$ (inclusive) to 5 $m^2/g$ (inclusive) is used to form the reinforcing layer. The reinforcing layer is formed by applying a ceramic paste by coating on the surfaces of the ceramic sheets that form the piezoelectric plate.

According to the piezoelectric transformer element of the present invention, the reinforcing layer which is made of a fine ceramic powder having the same composition as that of the ceramic sheets that form the piezoelectric plate and a particle size smaller than that of the ceramic sheets is selectively disposed on that portion of the piezoelectric plate where tensile stress concentrates when the piezoelectric transformer element is driven. Therefore, the particle size of the piezoelectric plate at this portion is small to provide a dense structure, thus partially reinforcing the strength. Hence, cracking or separation of the piezoelectric transformer element arising from tensile stress that occurs in the piezoelectric transformer element is also prevented. In the symmetric Rosen tertiary piezoelectric transformer element, only the stress-concentrating portion is selectively reinforced with the fine powder and the ceramic particle size stays the same at the driving portions or power generating portion. Hence, the condition for polarization need not be changed.

With the manufacturing method according to the present invention, in fabrication of the reinforcing layer, it can be formed densely and stably if screen printing using a ceramic paste is employed. Since the reinforcing layer has the same composition as that of the piezoelectric plate, internal defects such as void or separation do not occur during sintering the ceramic material.

The above and many other objects, features and advantages of the present invention will become manifest to those skilled in the art upon making reference to the following detailed description and accompanying drawings in which preferred embodiments incorporating the principles of the present invention are shown by way of illustrative examples.

DETAILED DESCRIPTION OF THE PREFERRED EMBODIMENTS

Figure 5:
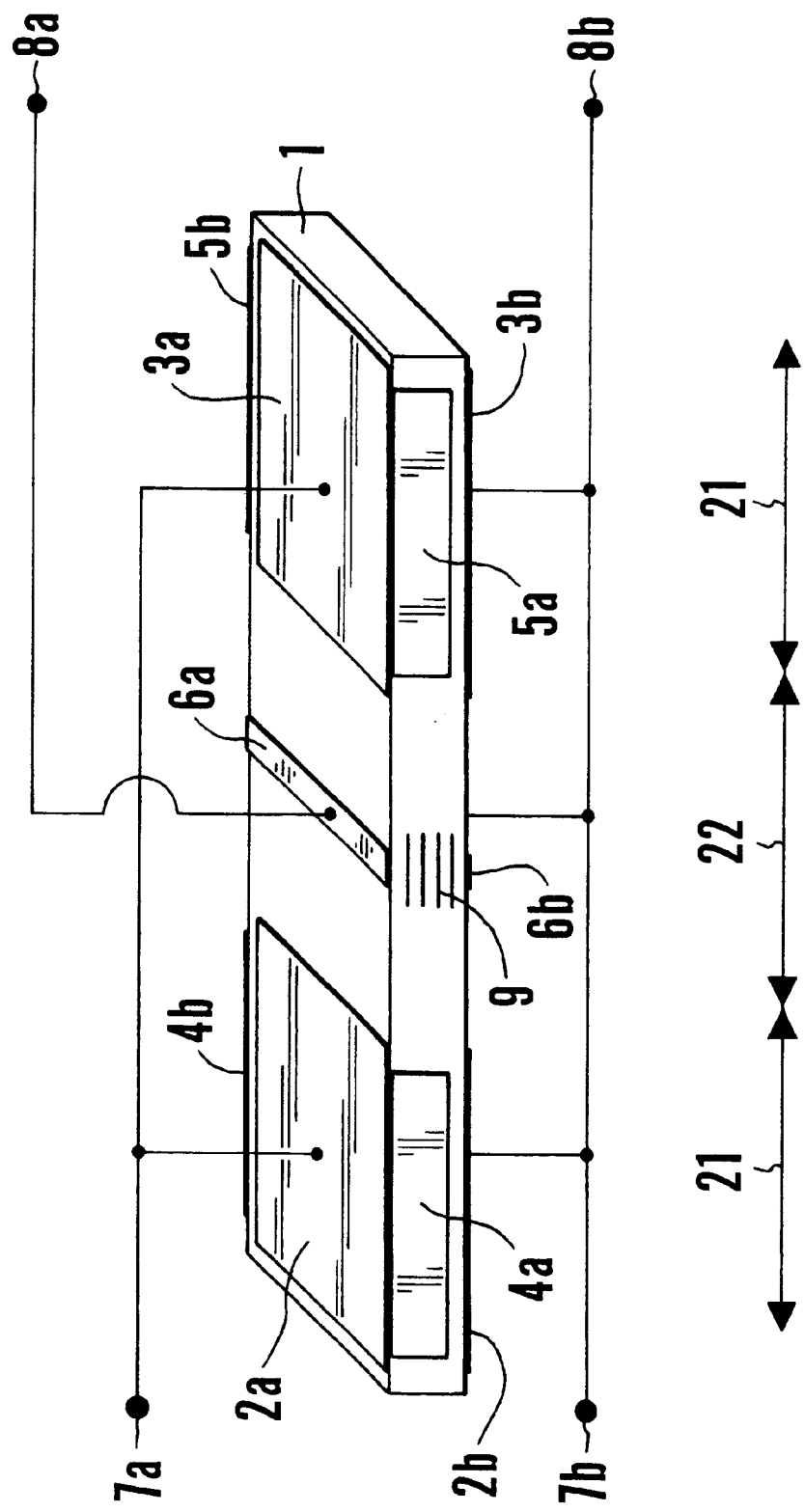
FIG. 5 is a perspective view of the first embodiment in which a piezoelectric transformer element according to the present invention is applied to a symmetric Rosen tertiary piezoelectric element.
Figure 6:
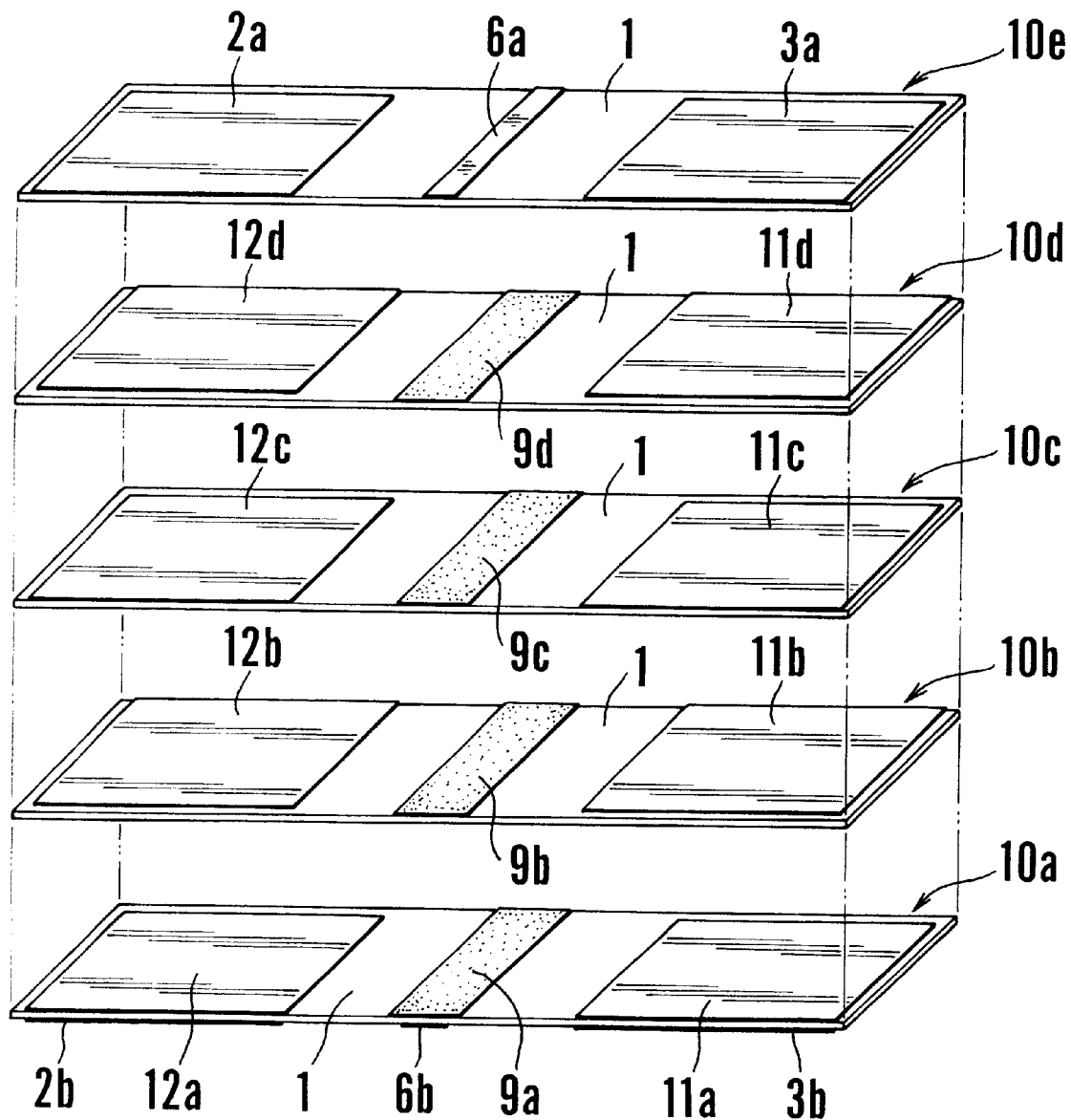
FIG. 6 is a partially exploded perspective view for explaining a method of manufacturing the piezoelectric transformer element shown in FIG. 5.

Several preferred embodiments of the present invention will be described with reference to the accompanying drawings. FIG. 5 is a perspective view showing the arrangement of the first embodiment of the present invention, and FIG. 6 is an exploded perspective view for explaining a method of manufacturing the first embodiment. In the first embodiment, the present invention is applied to a symetric Rosen tertiary piezoelectric transformer having a stacked layer structure. The two end portions of a rectangular piezoelectric plate 1 formed by stacking a plurality of ceramic layers form driving portions 21 serving as the input portions of a piezoelectric transformer element. Planar input electrodes 2a and 2b, and 3a and 3b, are formed on the upper and lower surfaces, respectively, of the piezoelectric plate 1.

These two end portions are polarized in the direction of thickness. The central portion of the piezoelectric plate 1 forms a power generating portion 22 serving as the output portion. In the power generating portion 22, output electrodes 6a and 6b are formed on the upper and lower surfaces, respectively, of the piezoelectric plate 1. This central portion is polarized in the direction of length of the piezoelectric plate 1.

As shown in FIG. 6, in the piezoelectric plate 1, a plurality of ceramic sheets (five ceramic sheets 10a to 10e in FIG. 6) are stacked. The upper surfaces of the four lower ceramic sheets 10a to 10d, among the ceramic sheets 10a to 10e, are respectively formed with internal electrodes 11a to 11d, and 12a to 12d, at regions corresponding to the driving portions 21. Those regions on the upper surfaces of the four ceramic sheets 10a to 10d, which correspond to the power generating portion 22 are respectively formed with reinforcing layers 9 (9a to 9d) at positions sandwiched by the output electrodes 6a and 6b. The five ceramic sheets 10a to 10e are stacked, pressed, an sintered to form the piezoelectric plate 1. As shown in FIG. 5, side electrodes 4a and 4b, and 5a and 5b, are formed on the respective side surfaces of the driving portions 21 of the piezoelectric plate 1. The side electrodes 4a and 4b, and 5a and 5b, alternately connect the internal electrodes in the stacking direction so as to be electrically connected to the input electrode 2a or 2b on the upper or lower surface, or 3a or 3b on the upper or lower surface of the corresponding driving portion 21.

To form the reinforcing layer 9, a ceramic paste, made of a powder having the same composition as that of the ceramic sheets constituting the piezoelectric plate 1 and a particle size smaller than that of the ceramic sheets, is applied to the central portion of each ceramic sheet in the direction of length as described above, that is, on a region overlapping the output electrodes, formed in the central portion of the power generating portions 22, in the direction of thickness. The respective ceramic sheets are stacked and formed in accordance with the same method as that employed for forming an ordinary piezoelectric plate. In this case, the ratio of the width of the reinforcing layer 9 in the direction of length of the piezoelectric plate 1 to the length of the piezoelectric plate 1 is set to fall within a required range. The particle size and width of the reinforcing layer will become clear from the description of the embodiments to be described hereinafter.

Figure 1:
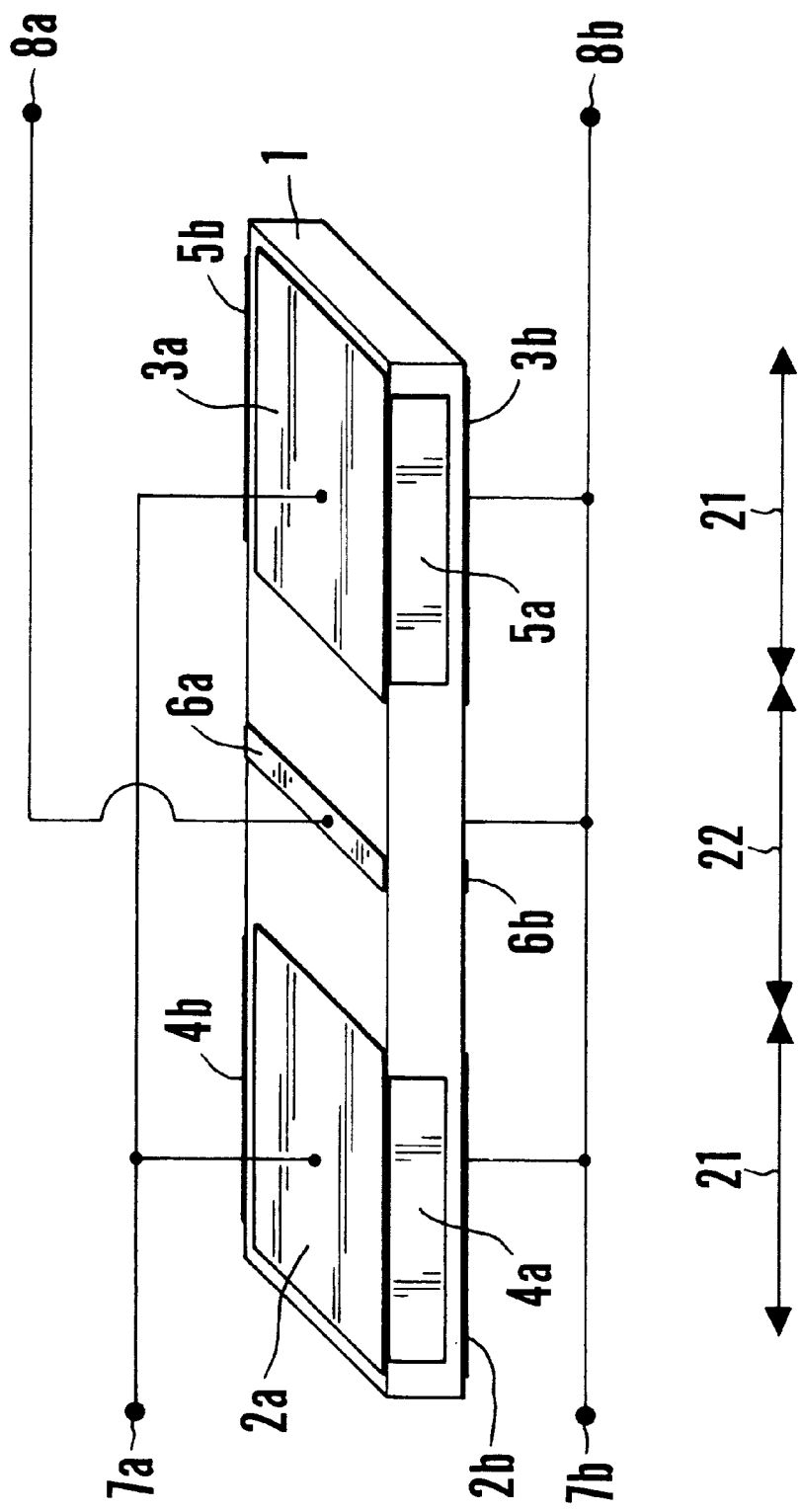
FIG. 1 is a perspective view showing a conventional symetric Rosen tertiary piezoelectric transformer.
Figure 2A:
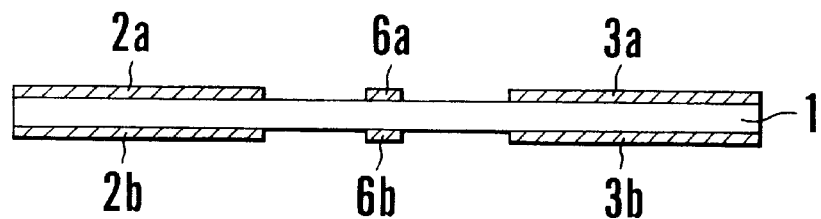
FIGS. 2A to 2C are views respectively showing the operation principle of the conventional symmetric Rosen tertiary piezoelectric transformer.
Figure 2B:
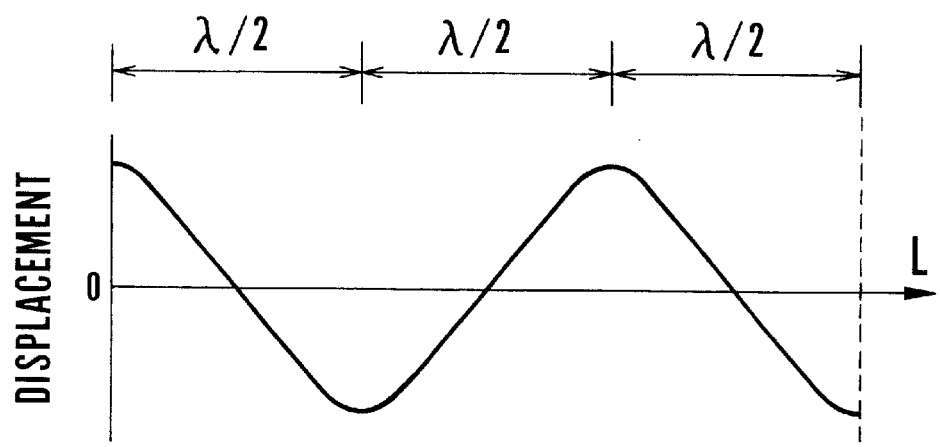
Figure 2C:
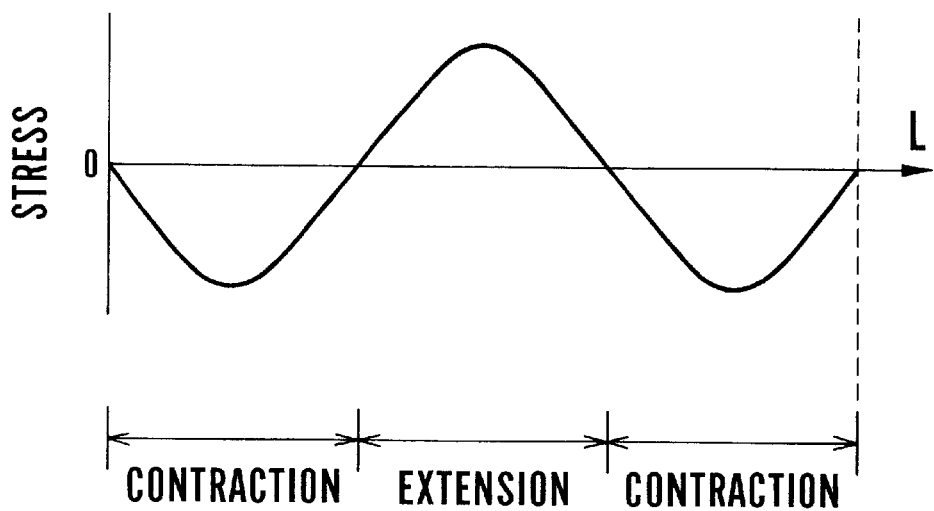
Figure 3A:
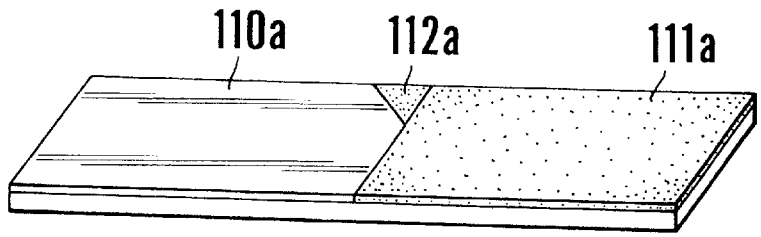
FIGS. 3A to 3E are exploded perspective views respectively showing the patterns of ceramic sheets that form a conventional piezoelectric transformer element.
Figure 3B:
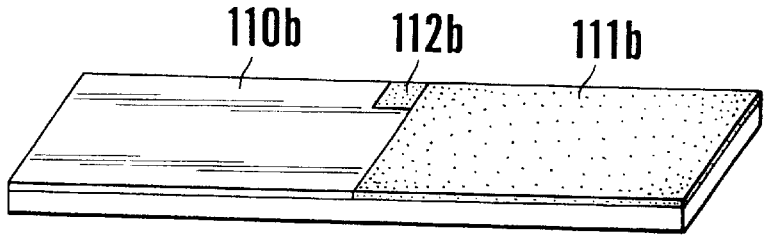
Figure 3C:
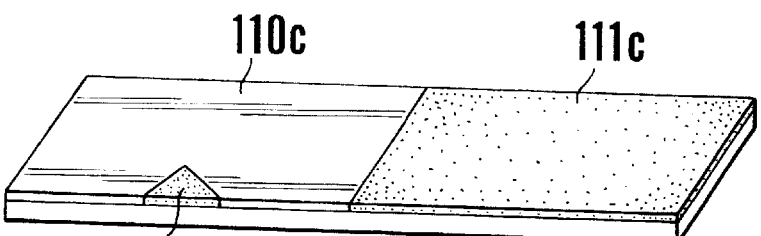
Figure 3D:
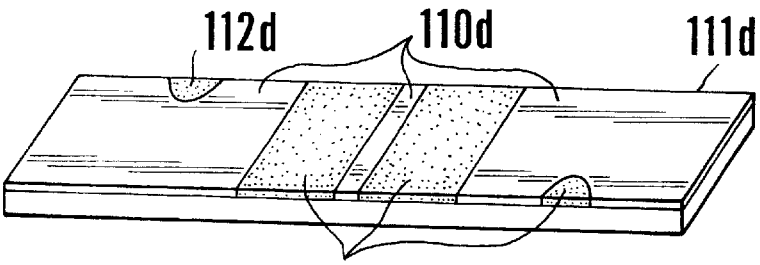
Figure 3E:
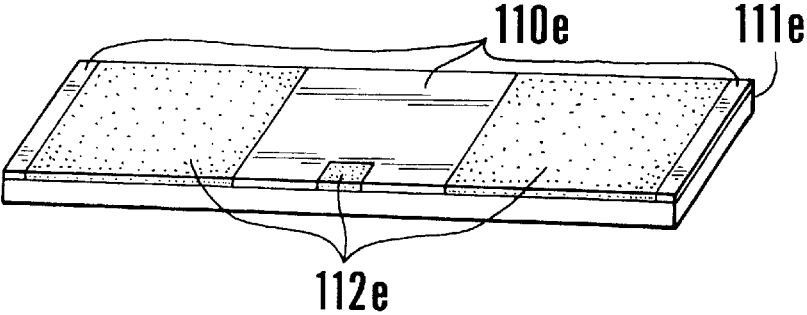
Figure 4A:
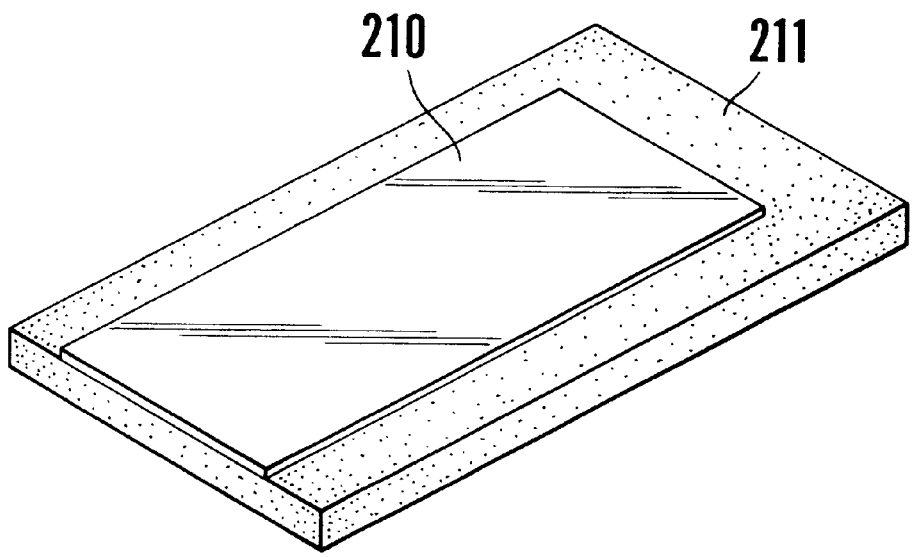
FIGS. 4A and 4B are exploded perspective views respectively showing the patterns of ceramic sheets that form a conventional stacked electronic component.
Figure 4B:
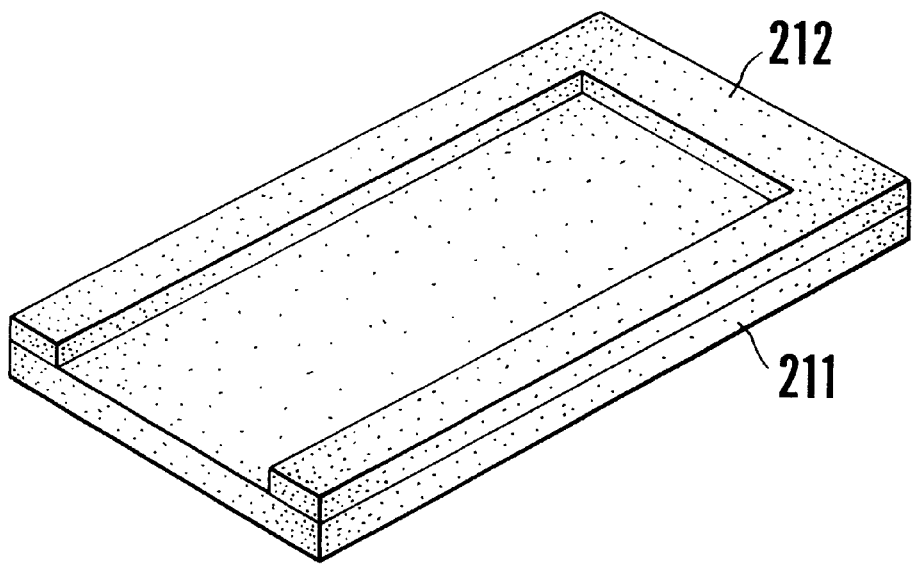

In the piezoelectric transformer element having the above arrangement, when a voltage is applied from external terminals 7a and 7b across the electrodes 2a and 2b, and 3a and 3b, of the driving portions 21, in the driving portions 21 an electric field is applied to the piezoelectric plate 1 in the direction of polarization. Longitudinal vibration in the direction of length is excited by the inverse piezoelectric effect in which the element is displaced in a direction perpendicular to the direction of polarization, so that the entire portion of the piezoelectric plate 1 vibrates as shown in FIG. 2B. In the power generating portion 22, mechanical strain occurs in the direction of polarization, and due to the piezoelectric positive effect in which a potential difference occurs in the direction of polarization, a voltage having the same frequency as that of the input voltage is output from the output electrodes 6a and 6b to external terminals 8a and 8b. When the piezoelectric transformer is driven, stress concentrates on the nodes of vibration, as shown in FIG. 2C. Tensile strain concentrates particularly at the central portion of the element in the direction of length. A ceramic material is resistant against compression stress but is weak against tensile stress. Hence, the element may crack at its central portion where the stress concentrates. Since the piezoelectric plate 1 has a reinforcing layer at the central portion of the element, the tensile stress described above is decreased to substantially nil by this reinforcing layer, and cracking or separation in the piezoelectric plate 1 is prevented.

The second embodiment of the present invention will be described. As a piezoelectric transformer element according to the second embodiment of the present invention, a five-layer piezoelectric transformer element having the arrangement shown in FIGS. 5 and 6 was fabricated. As the material of piezoelectric ceramic sheets 10a to 10e, a PZT ($PbZrO_3$—$PbTiO_3$) -based ceramic material having a specific powder surface area of about 2 $m^2/g$ was used. An AgPd alloy was printed on the two ends of the piezoelectric ceramic sheets 10a to 10d by screen printing to form driving internal electrodes 11a to 11d, and 12a to 12d, and a ceramic powder having the same composition as that of the piezoelectric ceramic sheets was printed by screen printing to form reinforcing layers 9a to 9d. Four types of piezoelectric plates were formed, of which the particle sizes of the powder that formed the reinforcing layers 9a to 9d were differed. More specifically, fine ceramic powders having a specific powder surface area of 2 $m^2/g$, 3 $m^2/g$, 4 $m^2/g$, and 5 $m^2/g$ were used. The coating thickness and width of the reinforcing layers 9a to 9d were fixed to 25 μm and 5 mm, respectively. Ag paste was printed on the respective piezoelectric plates by screen printing, and the plates were calcined to obtain a piezoelectric transformer element formed with input electrodes 2a and 2b, and 3a and 3b, side electrodes 4a and 4b, and 5a and 5b, and output electrodes 6a and 6b. The width of each output electrode was 1 mm. A voltage of 2 kV/mm was applied to the driving and power generating portions of the resultant element in an insulating oil at 170° C. to perform polarization. Four piezoelectric transformer element samples were finally obtained for each width type.

Figure 7:
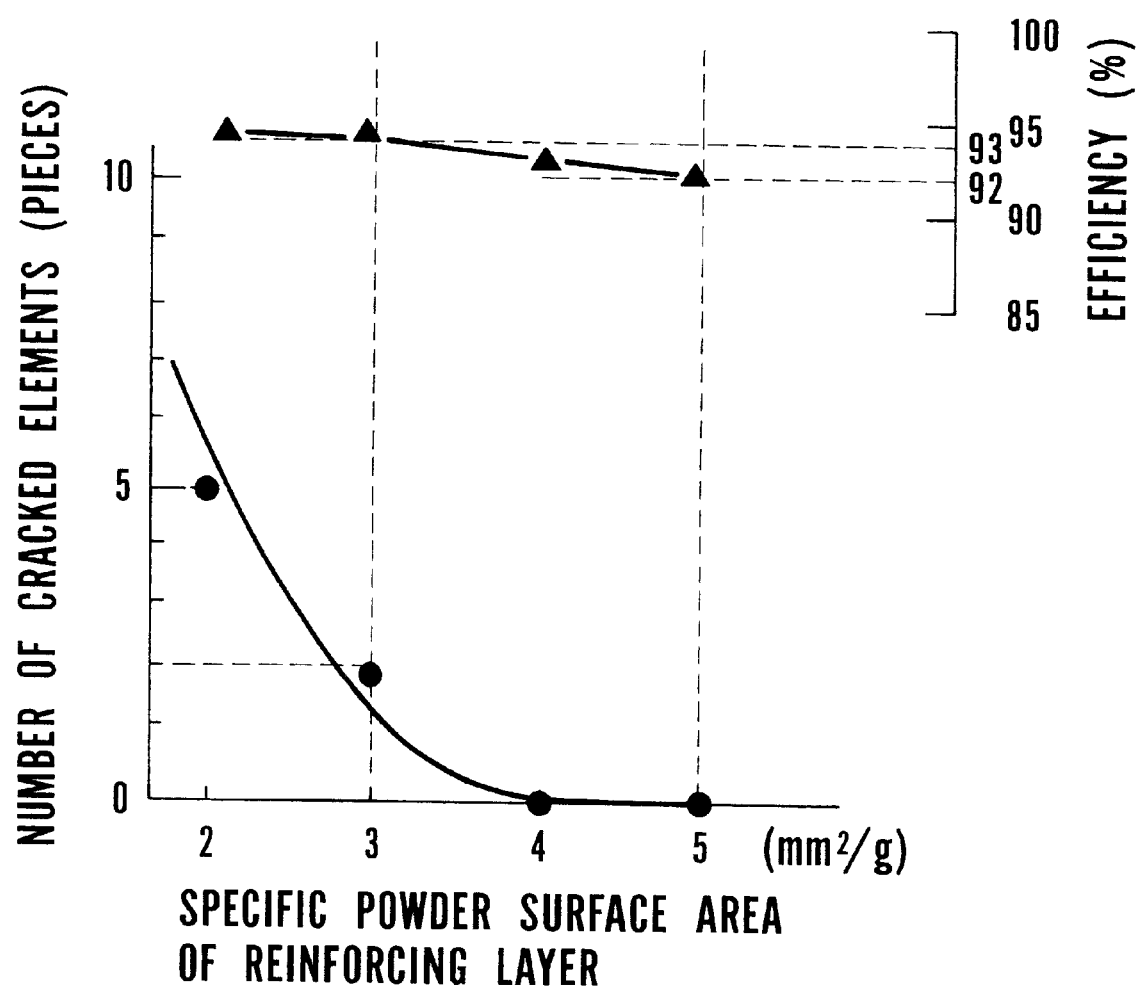
FIG. 7 is a graph showing the relationship among the specific powder surface area of a reinforcing layer, the number of cracked elements, and the efficiency of the second embodiment of the present invention.

A voltage was applied to the input side of these piezoelectric transformer elements for 5 minutes in the no-load state such that the vibration speed became 1 to 1.2 m/s. A breakdown test was performed for 10 sample pieces of each width type. FIG. 7 shows the result obtained from the breakdown test. An efficiency with which an output of 3 W was obtained when a 100-kΩ resistor was connected as the load was also examined. In the graph of FIG. 7, the axis of abscissa represents the specific powder surface area of the reinforcing layer, the left axis of ordinate represents the number of cracked elements, and the right axis of ordinate represents the conversion efficiency. As is apparent from FIG. 7, with the piezoelectric transformer according to the present invention, when the material of the reinforcing layer 9 has a specific powder surface area equal to or larger than 3 $m^2/g$, cracking at the central portion of the piezoelectric transformer element can be prevented. If the specific powder surface area exceeds 5 $m^2/g$, agglomerated powder becomes hard, and a ceramic paste having a good dispersing property cannot be obtained. Therefore, as the powder of the reinforcing layer 9, one having a specific surface area equal to or less than 5 $m^2/g$ is preferable.

Subsequently, the third embodiment of the present invention will be described. As a piezoelectric transformer element according to the third embodiment of the present invention, a five-layer piezoelectric transformer element having the arrangement shown in FIGS. 5 and 6 was fabricated. As the material of piezoelectric ceramic sheets 10a to 10e, a PZT ($PbZrO_3$—$PbTiO_3$) -based ceramic material having a specific powder surface area of about 2 $m^2/g$ was used. An AgPd alloy was printed on the two ends of the piezoelectric ceramic sheets 10a to 10d by screen printing to form driving internal electrodes 11a to 11d, and 12a to 12d, and a fine ceramic powder having the same composition as that of the piezoelectric ceramic sheets and a specific powder surface area of about 4 $m^2/g$ was printed by screen printing to form reinforcing layers 9a to 9d. Four types of piezoelectric plates, of which the reinforcing layers 9a to 9d had a fixed coating thickness of 25 μm and different widths of 1 mm, 2 mm, 5 mm, and 7 mm, were fabricated. The fabricated, stacked piezoelectric plates has a length of 42 mm, a width of 5 mm, and a total thickness of 1 mm. Accordingly, the proportion of the width of the reinforcing layer to the entire length of the piezoelectric plates (element) of the four types of piezoelectric plates is 2.4%, 4.8%, 11.9%, and 16.7%. Ag paste was printed on the these piezoelectric plates by screen printing, and the plates were calcined to obtain a piezoelectric transformer element formed with input electrodes 2a and 2b, and 3a and 3b, side electrodes 4a and 4b, and 5a and 5b, and output electrodes 6a and 6b. The width of each output electrode was 1 mm. Next, a voltage of 2 kV/mm was applied to the driving and power generating portions of the resultant element in an insulating oil at 170° C. to perform polarization. Four piezoelectric transformer element samples were finally obtained for each width type.

Figure 8:
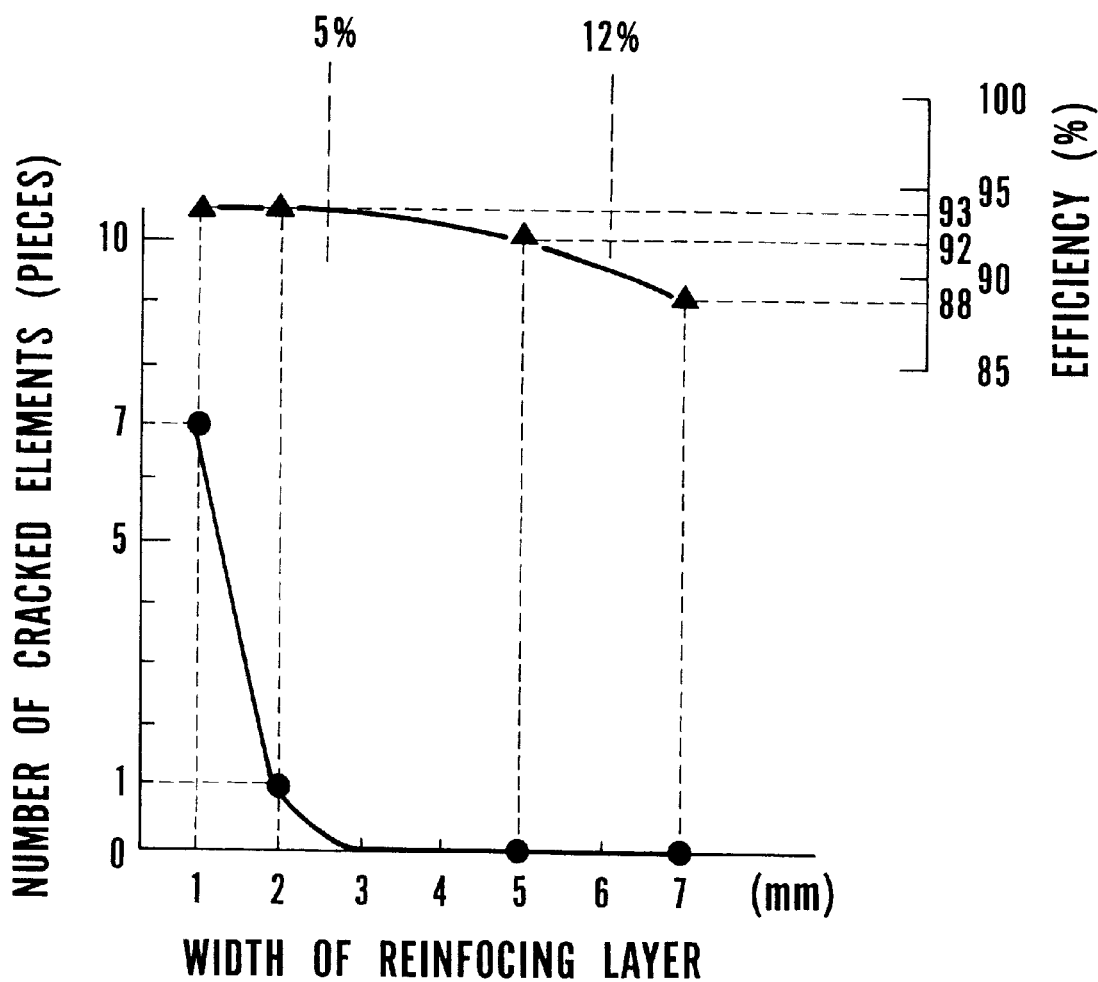
FIG. 8 is a graph showing the relationship among the width of a reinforcing layer, the number of cracked elements, and the efficiency of the third embodiment of the present invention.

A voltage was applied to the input side of these piezoelectric transformer elements for 5 minutes in the no-load state such that the vibration speed became 1 to 1.2 m/s. A breakdown test was performed for 10 sample pieces of each width type. FIG. 8 shows the result obtained from the breakdown test. In all the elements, fracture occurred near the central portion of the element. An efficiency with which an output of 3 W was obtained when a 100-kΩ resistor was connected as the load was also examined. In the graph of FIG. 8, the axis of abscissa represents the width of the reinforcing layer, the left axis of ordinate represents the number of cracked elements, and the right axis of ordinate represents the conversion efficiency. As is apparent from FIG. 8, when a ceramic paste made of a powder having the same composition as that of the ceramic material that formed the piezoelectric ceramic sheets and a smaller particle size than that was selectively applied to that portion of the piezoelectric ceramic sheets, where tensile strain concentrates when the piezoelectric transformer was driven, to form the strength reinforcing layers, and the width of the strength reinforcing layer was increased to be equal to or larger than 5% of the entire length of the element, cracking at the central portion of the element was suppressed. Also, when the electrode width was less than 12%, the piezoelectric transformer element maintained a high conversion efficiency of equal to or higher than 90%.

In the above description, the present invention is applied to a stacked piezoelectric transformer element formed by stacking a plurality of ceramic sheets and having internal electrodes among the stacked layers. The present invention can similarly be applied to a single plate type piezoelectric transformer element having no internal electrode. In this case, a reinforcing layer that satisfies the specific powder surface area and width described above is integrally buried in the central portion, in the direction of length, of a ceramic green sheet that forms a piezoelectric plate. A piezoelectric plate or piezoelectric transformer element may be fabricated in accordance with the same manufacturing method as the conventional method.

What is claimed is:

1. A piezoelectric transformer element comprising a piezoelectric plate made of a ceramic material, and input and output electrodes formed on said piezoelectric plate, to output a voltage from said output electrode upon application of a voltage to said input electrode, wherein a reinforcing layer, made of a ceramic material having the same composition as that of said ceramic material forming said piezoelectric plate and a particle size, after sintering, smaller than that of said ceramic material, is selectively disposed on a portion of said piezoelectric plate where tensile stress concentrates when said piezoelectric transformer element is driven.

2. A piezoelectric transformer element according to claim 1, wherein said piezoelectric plate is made of a ceramic material consisting of a ceramic powder having a specific powder surface area of 2 $m^2/g$, and said reinforcing layer is made of a ceramic material consisting of a ceramic powder having a specific powder surface area falling within the range from 3 $m^2/g$ (inclusive) to 5 $m^2/g$ (inclusive).

3. A piezoelectric transformer element according to claim 1, wherein said reinforcing layer is formed to have a width, in a direction of length of said piezoelectric plate, which falls within the range from 5% (inclusive) to 12% (inclusive) of the length of said piezoelectric plate.

4. A piezoelectric transformer element according to claim 1, wherein said piezoelectric plate is formed by stacking a plurality of ceramic sheets, and said reinforcing layer is interposed in each of gaps among said plurality of ceramic sheets.

5. A piezoelectric transformer element according to claim 1, wherein input portions respectively having input electrodes are disposed at two side portions in a direction of length of said piezoelectric plate, an output portion having an output electrode is formed at a substantially central portion in the direction of length of said piezoelectric plate, and said reinforcing layer is formed in a region in the direction of length that includes said output electrode.

* * * * *